United States Patent
Ghyselen et al.

(10) Patent No.: US 7,018,910 B2
(45) Date of Patent: Mar. 28, 2006

(54) TRANSFER OF A THIN LAYER FROM A WAFER COMPRISING A BUFFER LAYER

(75) Inventors: Bruno Ghyselen, Seyssinet (FR); Cécile Aulnette, Grenoble (FR); Bénédite Osternaud, Saint Egreve (FR)

(73) Assignee: S.O.I.Tec Silicon on Insulator Technologies S.A., Bernin (FR)

( * ) Notice: Subject to any disclaimer, the term of this patent is extended or adjusted under 35 U.S.C. 154(b) by 0 days.

(21) Appl. No.: 10/614,327

(22) Filed: Jul. 8, 2003

(65) Prior Publication Data
US 2004/0157409 A1    Aug. 12, 2004

Related U.S. Application Data

(60) Provisional application No. 60/413,443, filed on Sep. 26, 2002.

(30) Foreign Application Priority Data

Jul. 9, 2002    (FR) ................................ 02 08600

(51) Int. Cl.
*H01L 21/30*     (2006.01)
(52) U.S. Cl. ................ 438/458; 438/149; 438/933
(58) Field of Classification Search ................ 438/149, 438/478, 479, 458, 933, 507, 508, 509, 522, 438/530, 483, 763, 517
See application file for complete search history.

(56) References Cited

U.S. PATENT DOCUMENTS

| | | | |
|---|---|---|---|
| 5,882,987 A | 3/1999 | Srikrishnan | 438/458 |
| 6,059,895 A | 5/2000 | Chu et al. | 148/33.1 |
| 6,107,653 A * | 8/2000 | Fitzgerald | 257/191 |
| 6,313,016 B1 * | 11/2001 | Kibbel et al. | 438/478 |
| 6,323,108 B1 | 11/2001 | Kub et al. | 438/458 |
| 6,326,285 B1 * | 12/2001 | Behfar et al. | 438/455 |
| 6,350,993 B1 * | 2/2002 | Chu et al. | 257/19 |
| 6,403,450 B1 | 6/2002 | Maleville et al. | 438/471 |
| 6,410,371 B1 | 6/2002 | Yu et al. | 438/151 |
| 6,524,935 B1 | 2/2003 | Canaperi et al. | 438/478 |
| 6,573,126 B1 | 6/2003 | Cheng et al. | 438/149 |

(Continued)

FOREIGN PATENT DOCUMENTS

GB    2 365 214    2/2002

(Continued)

OTHER PUBLICATIONS

E.A. Fitzgerald et al., *Relaxed $Ge_xSi_{1-x}$ structures for III-V integration with Si and high mobility two-dimensional electron gases in Si*; J. Vac.Sci.Technol; B 10(4), Jul./Aug. 1992; pp. 1807-1819.

(Continued)

*Primary Examiner*—M. Wilczewski
(74) *Attorney, Agent, or Firm*—Winston & Strawn LLP

(57) ABSTRACT

A process for producing a structure of a thin layer of semiconductor material obtained from a composite structure donor wafer. The donor wafer includes a lattice parameter matching layer of a matching substrate that advantageously has an upper layer of semiconductor material having a first lattice parameter. A film of semiconductor material having a second, nominal, lattice parameter that is substantially different from the first lattice parameter is strained by the matching layer. A region of weakness is created in the matching substrate to facilitate splitting. A relaxed layer has a nominal lattice parameter that is substantially identical to the first lattice parameter. The relaxed layer is transferred to a receiving substrate. A number of different wafers can be made by this process.

27 Claims, 2 Drawing Sheets

U.S. PATENT DOCUMENTS

| | | | |
|---|---|---|---|
| 6,593,625 B1 * | 7/2003 | Christiansen et al. | 257/347 |
| 6,603,156 B1 * | 8/2003 | Rim | 257/190 |
| 6,649,480 B1 * | 11/2003 | Fitzgerald et al. | 438/285 |
| 6,649,492 B1 * | 11/2003 | Chu et al. | 438/478 |
| 6,703,144 B1 * | 3/2004 | Fitzgerald | 428/641 |
| 6,713,326 B1 * | 3/2004 | Cheng et al. | 438/149 |
| 6,723,661 B1 * | 4/2004 | Fitzergald | 438/763 |
| 6,737,670 B1 * | 5/2004 | Cheng et al. | 257/19 |
| 6,767,802 B1 * | 7/2004 | Maa et al. | 438/406 |
| 6,780,796 B1 * | 8/2004 | Maa et al. | 438/795 |
| 6,790,747 B1 | 9/2004 | Henley et al. | 438/458 |
| 6,812,116 B1 * | 11/2004 | Huang et al. | 438/464 |
| 6,953,736 B1 * | 10/2005 | Ghyselen et al. | 438/458 |
| 2004/0053477 A1 * | 3/2004 | Ghyselen et al. | 438/465 |
| 2004/0067622 A1 * | 4/2004 | Akatsu et al. | 438/459 |
| 2005/0153524 A1 * | 7/2005 | Maa et al. | 438/458 |
| 2005/0167002 A1 * | 8/2005 | Ghyselen et al. | 148/33 |
| 2005/0170611 A1 * | 8/2005 | Ghyselen et al. | 438/458 |
| 2005/0191825 A1 * | 9/2005 | Ghyselen et al. | 438/458 |

FOREIGN PATENT DOCUMENTS

| | | |
|---|---|---|
| JP | 10-209453 | 8/1988 |
| WO | 01/11930 | 2/2001 |
| WO | 01/99169 | 12/2001 |
| WO | 02/33746 | 4/2002 |

OTHER PUBLICATIONS

R. Egloff et al., *Evaluation of Strain Sources in Bond and Etchback Silicon-on-Insulator*; Philips Journal of Research; vol. 49, No. 1/2 1995; pp 125-138.

Cher Ming Tan et al., *Temperature and Stress Distribution in the SOI Structure During Fabrication*; IEEE Transactions on Semiconductor Manufacturing, vol. 16, No. 2, May 2003; pp. 314-317.

L.J. Huang et al., *SiGe-On-Insulator Prepared by Wafer Bonding and Layer Transfer for High Performance Field-Effect Transistors*, Applied Physics Letters, Feb. 26, 2002, vol. 78, No. 9.

* cited by examiner

TRANSFER OF A THIN LAYER FROM A WAFER COMPRISING A BUFFER LAYER

This application claims the benefit of Provisional application Ser. No. 60/413,443, filed Sept. 26, 2002.

FIELD OF THE INVENTION

The present invention relates to a transfer of thin layers from a wafer to a receiving substrate, in order to form structures such as a semiconductor-on-insulator structure, also called an SeOI (semiconductor-on-insulator) structure.

BACKGROUND OF THE INVENTION

Certain processes for transferring the layer of relaxed material grown epitaxially on a buffer layer from the wafer on to a receiving substrate are known. Such processes are, for example, disclosed in an IBM article by L. J. Huang et al. ("SiGe-On-Insulator prepared by wafer bonding and layer transfer for high-performance field-effect transistors", Applied Physics Letters, 26 Feb. 2001, Vol. 78, No. 9) and in PCT patent application WO 02/33746, in which documents an SGOI (Silicon-Germanium-On-Insulator) structure is produced from a wafer comprising in succession a single-crystal Si support substrate, an SiGe buffer layer and a relaxed SiGe layer.

The process employed by L. J. Huang et al. consists in carrying out the SMART-CUT® process of SOITEC, one which is generally known to those skilled in the art, and descriptions of which may be found in a number of works dealing with wafer reduction techniques, in order to remove the relaxed SiGe layer so as to transfer it by means of bonding on to an oxidized receiving substrate, thus producing an SGOI structure. Despite the advantages that this process affords, the surface of the transferred layer may have a roughness that requires a surface finishing step. This finishing step is generally carried out by means of CMP (chemical-mechanical polishing or chemical-mechanical planarization), which may create surface defects (such as strain-hardened regions), which may imperfectly correct the thickness, and thus retain inhomogeneous layer thicknesses, and which may slow down the transfer of the SiGe layer, and increase its cost.

The process disclosed in PCT application WO 02/33746 includes, in addition to a CMP polishing step, preliminary lapping, polishing and etching steps in order to remove part of the wafer, thereby slowing down the overall process of removal from the wafer and increasing its cost even further, while not ensuring good homogeneity in layer thickness. To try to alleviate this, U.S. Pat. No. 5,882,987 and an article by K. D. Hobart et al. from the Naval Research Laboratory in Washington ("On scaling the thin film Si thickness of SOI substrates") both disclose an overall process for producing SOI (silicon-on-insulator) structures from a wafer comprising in succession a single-crystal Si support substrate, an SiGe layer and an epitaxially grown Si layer bonded to an oxidized receiving substrate.

The SMART-CUT® technique is employed and causes, after bonding the wafer to a receiving substrate, detachment of part of the wafer at the Si support substrate. A structure consisting in succession of part of the Si support substrate, the SiGe layer and the epitaxially grown Si layer is thus removed, the whole assembly being bonded to the oxidized receiving substrate.

Two successive selective etching operations are then carried out on the structure in order to remove firstly the remaining part of the Si support substrate with an etching solution such that the SiGe layer forms a stop layer and then in order to remove the SiGe layer with an etching solution such that the Si layer forms a stop layer.

The structure obtained at the end is an SOI structure with a surface Si layer. Thus, an SeOI structure is obtained with a semiconductor layer which is both thin and uniform through the thickness, substantially identical to the epitaxially grown initial layer, while avoiding the use of a finishing step other than a selective etching operation. The SiGe layer inserted between the Si wafer and the epitaxially grown Si layer, however, has a typical thickness of between 0.01 and 0.2 microns, a thickness which is insufficient to fulfill the role of a buffer layer between the Si wafer and a potential relaxed SiGe layer. The wafer therefore does not include a buffer layer. In addition, given the order of magnitude of the thickness of the inserted SiGe layer, the structural (strained, relaxed or intermediate) state of the latter does not seem defined with certainty.

PCT patent application WO 01/99169 discloses processes for producing, from a wafer consisting in succession of an Si substrate, an SiGe buffer layer, a relaxed SiGe layer and optionally a strained Si or SiGe layer, a final structure with the relaxed SiGe layer on the optional other strained Si or SiGe layer. The technique employed for producing such a structure involves, after bonding the wafer to a receiving substrate, removal of the material of the wafer that it is desired not to retain, by selectively etching the Si substrate and the SiGe buffer layer. Although this technique does make it possible to achieve particularly small layer thicknesses which are homogeneous through the thickness, it entails destruction of the Si substrate and the SiGe buffer layer by chemical etching. These processes therefore do not allow the possibility of reusing part of the wafer, and especially at least part of the buffer layer, for a further transfer of layers.

A method for transferring a semiconductor wafer with high quality, smooth and uniform, surface is thus desired, preferably which can be reused for transferring further layers.

SUMMARY OF THE INVENTION

The invention is directed to a method of preparing a semiconductor wafer. In the preferred embodiment of the inventive method, a first layer of a first material is grown on a matching layer of a matching substrate, and a second layer of a semiconductor second material, different from the first material, is grown on the first layer. The second layer is generally in a relaxed state and is grown on the first layer to form a boundary between the first and second layers and to form a composite structure which comprises the matching, first, and second layers. Additionally, the first and second layers each have substantially the same first lattice parameter to facilitate growth of the second layer on the first layer. The first layer is then removed from the second layer, such as by etching, to directly produce a boundary on the second layer that is substantially smooth and of substantially uniform thickness.

The matching layer preferably has the same lattice parameter where it contacts the first layer. When the matching layer is grown on a handling substrate that has a second lattice parameter that is different from the first lattice parameter, the lattice parameter of the matching layer can be graded between the first and second lattice parameters to facilitate growth of the matching layer on the handling substrate. Preferably, the matching layer includes a buffer layer and a relaxed surface layer.

In a preferred embodiment, the composite structure is split to provide (a) an unfinished wafer that includes the second layer, and (b) a handle wafer that includes at least a portion of the matching layer. A receiving substrate may be associated with the second layer of the composite structure prior to splitting. A region of weakness is preferably created in the matching substrate to facilitate the splitting, such as by implanting atomic species or by adding a porous layer. The composite structure can be split e.g., through the first layer such that the handle wafer also includes a portion of the first layer. More preferably, the composite structure can be split, for example, through the matching layer such that the unfinished wafer includes the first layer. The unfinished wafer can then be finished to a final wafer, while the handle wafer can be re-used in the process.

Preferably, the first layer is strained to impart the first lattice parameter, and the lattice parameter of the first material when strained is different than the lattice parameter of this material in a relaxed state.

The method preferably produces the boundary of the second layer, with the first layer removed, in a condition that is of uniform thickness and that is sufficiently smooth for growing a substantially uniform and smooth device layer thereon of a semiconductor material that is different from that of the second layer and that has a lattice parameter that is adapted to match that of the second layer. More preferably, the boundary of the second layer substantially uniform and planar with few imperfections.

A receiving substrate may be attached to the second layer, preferably by bonding. When desired, an insulator can be provided between the second layer and receiving substrate. Thus, a wide variety of different wafers can be prepared by the present process. For example, a preferred first material is a semiconductor, and a device layer that comprises a semiconductor can preferably be grown on the boundary of the second layer.

A preferred embodiment of a semiconductor wafer constructed according to the invention is one that includes a matching layer as described above with a first layer of a first material grown directly on the matching layer. Then a second layer is grown on the first layer. The second layer preferably comprises a semiconductor second material in a relaxed state that is different from the first material and that has a lattice parameter that is substantially the same as the first lattice parameter.

The preferred semiconductor wafer also has a handling substrate on which the matching layer is grown and which is configured for supporting the matching, first, and second layers. The handling substrate can have a second lattice parameter, with the matching layer having a lattice parameter that is graded between the first and second lattice parameters. A receiving substrate preferably is supportively associated with the second layer. The preferred first layer is stressed to impart the first lattice parameter, and an insulator, in one embodiment, is disposed between the second layer and receiving substrate.

The invention provides a structure that makes available a high quality surface if a semiconductor layer, on which, for example, a device layer can be grown with very high smoothness and uniformity. Additionally, with the present invention, this surface can be provided with little polishing to prepare the semiconductor layer surface for the device layer due to the high quality produced prior to any polishing step.

BRIEF DESCRIPTION OF THE DRAWINGS

Further aspects of the present invention will become more clearly apparent on reading the following description, these being given by way of non-limiting example and with reference to the appended drawings in which.

DETAILED DESCRIPTION OF THE PREFERRED EMBODIMENTS

Figure 1:
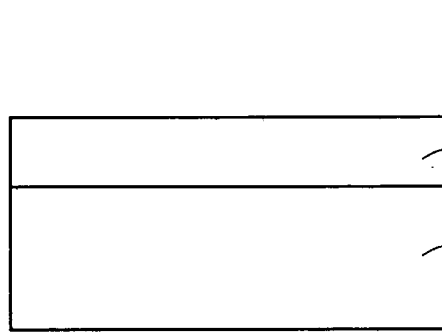
FIG. 1 shows a composite structure being produced with a matching layer grown on a handling substrate.

The present invention allows production of electronic structures whose active layer, that is to say the layer which comprises or which will comprise the electronic components, is particularly thin and particularly homogeneous through the thickness. Furthermore, these structures can be produced by transferring an active layer onto a receiving substrate from a wafer comprising a matching layer. Part of the wafer of the handling wafer, used in the production, and especially at least part of the matching layer, can be used for another transfer.

To assist in understanding the invention, the following definitions are used:

The term "boundary" is understood to mean a region that exists between two layers or the resulting surface that is obtained when one of the layers is removed, such as by etching. When present as a surface, the boundary is substantially free from elevated and depressed areas.

The term "buffer layer" is understood to mean a layer intermediate between two crystallographic structures with different lattice parameters, having in the region of one of its faces a lattice parameter substantially identical to that of the first structure and in the region of its other face a lattice parameter substantially identical to that of the second structure. A method of producing the buffer layer is described in U.S. Pat. No. 6,117,750. Thus, a wafer may, for example, comprise a single-crystal silicon (also called Si) wafer on which a relaxed layer of silicon-germanium (also called generally SiGe) is produced by means of a buffer layer, despite the difference in lattice parameter existing between these two materials.

The term "lattice parameter matching layer" denotes any structure behaving as a buffer layer and optionally having, on the surface, a layer of substantially relaxed material without an appreciable number of structural defects, such as dislocations.

The term "relaxed layer" means here any layer of a semiconductor material which has an unstrained crystallographic structure, that is to say one which has a lattice parameter substantially identical to the nominal lattice parameter of the material of the layer.

Conversely, the term "strained layer" means any layer of a semiconductor material whose crystallographic structure is strained in tension or in compression during crystal growth, such as epitaxy, requiring at least one lattice parameter to be substantially different from the nominal lattice parameter of this material. Thus, a buffer layer makes it possible to grow an SiGe layer on an Si substrate without this SiGe layer being strained by the substrate.

Given that bulk SiGe is usually not available on the market, the use of a buffer layer in a wafer in order to have a relaxed SiGe layer on the surface thus makes it possible to produce a structure which can thus fulfill the same functions as a bulk SiGe substrate.

The buffer layer inserted between the Si wafer and the relaxed SiGe layer is generally made of SiGe, with a quantity-wise proportion of germanium which progressively increases through the thickness of the wafer towards the relaxed layer.

This makes it possible to:
gradually increase the germanium content from the wafer towards the relaxed layer;
confine defects associated with the difference in lattice parameter so that they are buried; and
give a sufficiently thick relaxed SiGe layer stability with respect to a film of different material grown epitaxially on its surface in order to strain the latter so as to modify its lattice parameter without influencing that of the relaxed SiGe layer.

For all these reasons, the preferred buffer layer is sufficiently thick, typically having a thickness that is greater than one micron.

A final structure can be produced under the present invention that comprises one or more layers in substantially controlled structural states, such as a substantially relaxed SiGe layer, something which does not seem to be guaranteed in the production of a structures according to the prior art such as is described in the Hobart et al. article.

The invention also provides a process that can produce an electronic structure comprising a thin layer of semiconductor material from a wafer comprising a lattice parameter matching layer comprising an upper layer of semiconductor material having a first lattice parameter, such as with the following steps:
(a) growth of a film of semiconductor material on the upper layer of the matching layer, which film has a second, nominal, lattice parameter substantially different from the first lattice parameter, with a thickness small enough to keep the first lattice parameter of the upper layer of the subjacent matching layer and thus to be strained;
(b) growth of a relaxed layer of semiconductor material on the film, the said layer having a nominal lattice parameter substantially the same or even identical to the first lattice parameter;
(c) removal of at least part of the wafer on the matching layer side in relation to the relaxed layer, such as by:
formation of a region of weakness on the matching layer side in relation to the relaxed layer and
supply of energy into the region of weakness in order to detach a structure which includes the relaxed layer from the wafer.

The following steps may also be performed when desired:
after step (b) above, an additional step is carried out in which a receiving substrate is bonded to the wafer on the relaxed layer side;
in this case, the receiving substrate is made of silicon;
in either of these latter two cases, before bonding, a step of forming at least one bonding layer between the receiving substrate and the wafer is furthermore carried out, the bonding layer being formed on the receiving substrate and/or on the bonding face of the wafer;
in the latter case, the bonding layer is an electrically insulating material such as silica;
step (c) relates to removal of substantially all of the material of the wafer on the matching layer side in relation to the relaxed layer;
the region of weakness is formed by implantation of species into the matching layer at a depth substantially equal to the implant depth;
before step (b), the region of weakness is formed by porosification of a layer beneath the relaxed layer;
step (c) comprises, after the energy supply operation of step (c), at least one selective etching operation;
in the latter case, a selective etching operation relates to the etching of the film with respect to the relaxed layer;
in one of the latter two cases, a selective etching operation relates to the etching of the remaining part of the matching layer with respect to the film (after detachment of the wafer by energy supply)
the process furthermore comprises, after step (c), a step of growing a layer on the relaxed layer;
in this case, the growth layer on the relaxed layer is made of strained material;
the matching layer is made of silicon-germanium (the matching layer comprising a buffer layer with a germanium concentration which increases through the thickness and a relaxed layer beneath the film), the film of strained material is made of silicon, the relaxed layer is made of substantially relaxed silicon-germanium (with a germanium concentration substantially equal to the germanium concentration of the relaxed layer of the matching layer);
in the latter two cases, the growth layer produced on the relaxed layer is made of strained silicon so as to substantially preserve the lattice parameter of the subjacent relaxed silicon-germanium layer;
the wafer comprises at least one layer furthermore containing carbon with a carbon concentration in the layer substantially less than or equal to 50%;
the wafer comprises at least one layer furthermore containing carbon with a carbon concentration in the layer substantially less than or equal to 5%.

These processes result in the provision of various semiconductor structures:
a semiconductor-on-substrate structure produced in accordance with the above process, the thickness of the semiconductor of the structure being formed from the relaxed layer, the substrate being the receiving substrate;
the same structure with, furthermore, a layer of electrically insulating material beneath the thickness of the semiconductor of the structure so that the structure is a semiconductor-on-insulator structure;
an intermediate structure obtained during implementation of a process according to the invention, comprising in succession a substrate, a lattice parameter matching layer comprising an upper layer having a first lattice parameter, a film of strained material having a nominal lattice parameter substantially different from the first lattice parameter, and a layer made of substantially relaxed material having a nominal lattice parameter substantially identical to the first lattice parameter;
an intermediate structure obtained during implementation of a process according to the invention, comprising in succession a substrate, a layer of relaxed material having a nominal lattice parameter substantially identical to the first lattice parameter, and a film of strained material having a nominal lattice parameter substantially different from the first lattice parameter.

One embodiment of the inventive process will now be described below with reference to FIGS. 1–6, which illustrate the steps and resulting structures obtained when producing a semiconductor wafer or electronic structure that includes a thin SiGe layer. The final wafer is obtained by making a composite structure starting by forming a substructure that includes a donor wafer of a single-crystal silicon handling support substrate 1 and an SiGe lattice parameter matching layer 2. A matching substrate includes the support substrate 1 and the matching layer 2.

In this example, it is advantageous to choose a SiGe matching layer 2 comprising in succession of an SiGe buffer layer and a relaxed SiGe layer on the surface. The relaxed SiGe layer is optional but preferred. The buffer layer preferably has a germanium concentration which grows uniformly from the interface with the support substrate 1. The thickness of the buffer layer 2 is typically between 1 and 3 micrometers in order to obtain good structural relaxation of the surface layer.

The relaxed SiGe layer is preferably formed by epitaxy, preferably directly on the surface of the buffer layer and its thickness may vary widely depending on the case, with a typical thickness of between 0.5 and 1 micron.

The germanium concentration in the silicon within the relaxed SiGe layer is not limited in terms of value, but is preferably greater than 15% by weight in order to facilitate bonding to the epitaxially grown strained Si film 3 that is applied in the next step. The germanium concentration in the relaxed SiGe layer is typically between 15% and 30%, but may be greater than 30% by weight, if desired.

Figure 2:
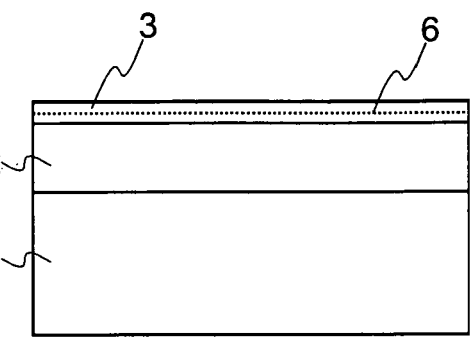
FIG. 2 shows the composite structure being produced with a stressed layer grown on the handling layer with a weakened region formed in the stressed layer.

With reference to FIG. 2, a Si film 3 is grown on the SiGe matching layer 2. In one embodiment, the film 3 is grown in situ, directly in continuation with the formation of the subjacent matching layer 2, the latter also being in this case advantageously formed by layer growth. In the second embodiment, the film 3 is grown after a gentle finishing step carried out on the surface of the subjacent matching layer 2, for example by CMP polishing.

The Si film 3 is preferably formed by epitaxy using techniques such as CVD (chemical vapor deposition) and MBE (molecular beam epitaxy) techniques. The silicon of the film 3 is then obliged by the matching layer 2 to increase its nominal lattice parameter in order to make it substantially identical to that of its growth substrate and thus introduce internal tensile strains.

It is preferred to form an Si film 3 that is sufficiently thin to preserve the strain across its thickness. A film with larger than preferred thickness could cause the strain in the thickness of the film to relax towards the nominal lattice parameter of the silicon and/or defects to be generated in the film 3. The thickness of the film 3 is preferably less than 200 angstroms in order to avoid any relaxation of the strain therein.

A weakened region 6 is preferably created in the composite structure that is being prepared. The weakened region 6 can be made at this time.

A first preferred technique for creating the weakened section 6, known to those skilled in the art as the SMART-CUTS® technique (descriptions of which may be found in a number of works dealing with wafer reduction techniques, such as U.S. Pat. No. 5,374,564), comprises a step of implanting atomic species such as ions, and preferably hydrogen ions. A second technique includes for obtaining the weakened region 6 interface is to create at least one porous layer, as described for example in U.S. Pat. No. 6,100,166.

Figure 8:
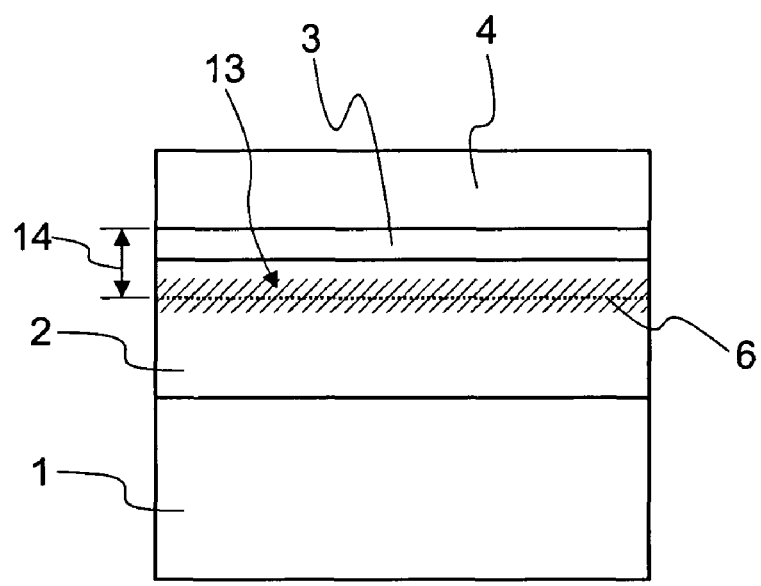
FIG. 8 shows a composite structure being produced with a weakened region disposed in the matching layer.

The weakened region 6 or layer of porous silicon can be formed within the support substrate 1, between the support substrate 1 and the matching layer 2, in the matching layer 2 (for example in a graded buffer layer or a relaxed layer of the matching layer), as shown in FIG. 8, or in the film 3, as shown in FIG. 2. Preferably, the weakened region is formed in a relaxed portion of the matching layer 2.

To form a weakened region 6 within the support substrate 1, the porous layer is advantageously formed on a single-crystal Si wafer and then a second growth is carried out on the porous layer, so as to grow a non-porous Si layer having substantially the same lattice parameter as the Si of the wafer. The composite structure in production at this stage would preferably thus include the support substrate 1 matching layer 2, the porous layer and the non-porous Si layer.

Figure 3:
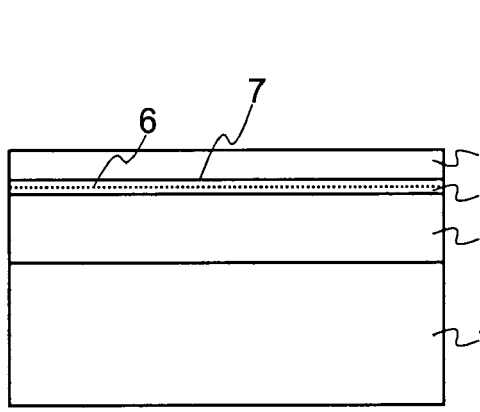
FIG. 3 shows the composite structure being produced with a relaxed layer grown on the stressed layer.

Referring to FIG. 3, a relaxed SiGe layer 4 is grown on the strained Si film 3, preferably by epitaxy (for example by CVD or MBE). This relaxed SiGe layer is produced either in situ, immediately after growth of the subjacent film 3, or after a gentle finishing step carried out on the surface of the subjacent film 3, such as a CMP polishing step.

The Ge concentration in this layer 4 is preferably substantially the same as that present near the bonding face of the matching layer 2, so as to keep the nominal matching parameter of the relaxed SiGe layer present at this level in the matching layer 2 and preserved in the strained Si film 3.

The thickness of this relaxed SiGe layer 4 may be from a few tens to a few hundreds of nanometers, and preferably is between 10 and 100 nanometers.

Figure 4:
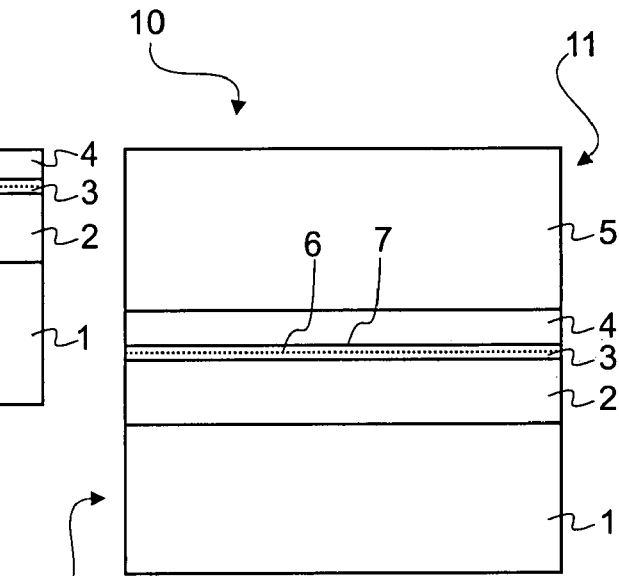
FIG. 4 shows the composite structure being produced with a receiving substrate bonded to the relaxed layer.

With reference to FIG. 4, a receiving substrate 5 is preferably bonded to the relaxed SiGe layer 4 to complete the composite structure 10 of this embodiment. This receiving substrate 5 may, for example, be made of silicon or may consist of other types of materials. The receiving substrate 5 in this embodiment is bonded by bringing it into intimate contact with the relaxed layer 4, advantageously effecting a molecular adhesion (wafer bonding) between the substrate 5 and the layer 4. This bonding technique, as well as variants, is described in the document entitled "Semiconductor Wafer Bonding" (Science and Technology, Interscience Technology) by Q. Y. Tong, U. Gosele and Wiley.

If necessary, bonding is accompanied by an appropriate prior treatment of the respective surfaces to be bonded and/or by supplying thermal energy and/or supplying an additional tie layer. Thus, for example, a heat treatment carried out during bonding allows the bonds to be strengthened.

Bonding may also be reinforced by a bonding layer inserted between the layer 4 and the receiving substrate 5, which makes it possible to produce molecular bonds both with the layer 4 and with the material constituting the bonding face of the receiving substrate 5 which are at least as strong as those existing between the layer 4 and receiving substrate 5.

Thus, silicon oxide (also called silica or $SiO_2$) is a material that may be chosen for producing such a bonding layer. The silica may be formed on the relaxed layer 4 and/or on the receiving substrate 5, by $SiO_2$ deposition or by thermal oxidation on the respective bonding surfaces.

Advantageously, the material constituting the bonding face of the receiving substrate 5 and/or the material of the bonding layer optionally formed is electrically insulating in order in the end to produce an SeOI structure 20, the semiconductor layer of which is the transferred relaxed layer 4.

Once the receiving substrate 5 has been bonded, the composite structure is split between a handling portion 11 and an unfinished portion 12. Part of the composite structure 10 is thus removed from the unfinished portion 12 to transfer the relaxed SiGe layer 4 on the receiving substrate 5 and thus produce the unfinished portion 12.

In the embodiment shown, substantially all that part of the wafer 10 on the matching layer 2 side in relation to the relaxed SiGe layer 4 is removed. In the process involving the embodiment of FIG. 8, however, more of layer 2 remains in the unfinished portion.

In a preferred embodiment, when the weakened region 6 is formed, a damaged region 13 is formed adjacent thereto, typically on both sides of the weakened region. In this embodiment, the weakened region 6 is created at a depth 14 from layer 2 such that the damaged region 13 substantially remains outside layer 2. The depth 14 is thus preferably sufficient for substantially preventing damage to layer 2 or boundary 7. In one embodiment, the thickness of the damaged layer can be around ten times the thickness of the strained layer 3.

Figure 5:
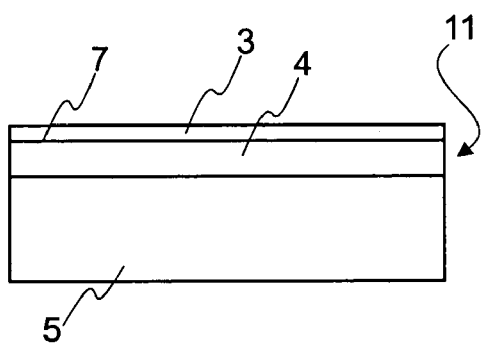
FIG. 5 shows an unfinished wafer portion split from the remainder of the composite structure at the weakened portion.
Figure 6:
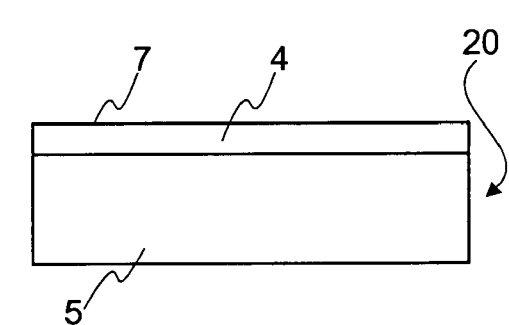
FIG. 6 shows the unfinished wafer with the remaining portion of the stressed layer removed.

With reference to FIGS. 5 and 6, the remaining material from the matching layer 2 or the stressed layer 3 is removed by cutting the donor wafer or composite structure 10 at the weakened region 6. The weakened region 6 is subjected to a heat treatment and/or mechanical treatment, or another supply of energy, in order to split the region of weakness 6.

Preferably, the splitting removes substantially the entire portion of the composite structure on the matching layer side 2 of the film 3. Splitting a region of weakness 6 formed in the matching layer 2 makes it possible to remove some and preferably most of the composite structure 10, in order to obtain an unfinished wafer 12 structure comprising the remainder of the matching layer 2, the strained Si film 3, the relaxed SiGe layer 4, and the optional bonding layer and the receiving substrate 5.

When a porous silicon layer is used to split the structure, the wafer 10 is advantageously treated in order to remove the porous silicon which remains after splitting. This is typically an etching operation or a heat treatment. Generally, the etching alone provides a sufficiently smooth and uniform surface such that polishing, in particular, extensive polishing, is not required before depositing or growing a substantially uniform and smooth device layer thereon of a semiconductor material thereon. The device layer can be and preferably is of a material that is different from that of the SiGe layer 4 and has substantially the same lattice parameter as that of the SiGe layer 4. If, instead, the porous layer lies within the support substrate 1, a lapping, chemical-mechanical polishing and/or selective chemical etching operations are then advantageously carried out in order to remove the remaining part of the support substrate 1.

A substantial part of the composite structure 10 is thus rapidly removed, en bloc, from the unfinished wafer 12. They also allow the possibility of reusing the removed part of the wafer 10 in another process, such as a repeated process as described above according to the invention. Thus, in embodiments in which the handling portion 11 removed is the support substrate 1, an operation to reform a matching layer 2, a film 3 and a relaxed layer 4 may be carried out again as described above, after the surface of the handling portion 11, which may be the surface of the support substrate 1 in certain embodiments, has been polished.

A second material removal operation after cutting the composite structure 10 includes removing, if necessary, the remaining part of the matching layer 2. This operation may be carried out by selective chemical etching so that the strained Si film 3 undergoes little or no etching, the film 3 acting as etch-stop layer.

The remaining part of the matching layer 2 is preferably etched by wet etching using etching solutions that have a substantial selectivity with respect to the strained Si film 3, such as a solution comprising $HF/H_2O_2/CH_3COOH$ (approximately 1/1000 selectivity) or HNA (hydrofluoric-nitric-acetic solution).

Dry etching operations may also be carried out in order to remove material, such as plasma etching, or by sputtering. This chemical method has the main advantage of being quite rapid for thin layers to be removed and of avoiding the use of chemical-mechanical polishing finishing operations usually employed after cutting the wafer. The chemical etching operation may, however, be advantageously preceded, such as in an embodiment in which a thicker layer is to be removed, by mechanical or chemical-mechanical abrasion by lapping and/or chemical-mechanical polishing CMP of the remaining part of the matching layer 2.

These techniques are proposed by way of an example in the present document, the invention covering all types of techniques suitable for removing material from a wafer 10 in accordance with the process according to the invention. In another embodiments, these techniques are not required.

A further material removal step, shown in FIG. 6, involves removing the film 3 chemically. To do this, it is preferred to use selective etching employing an etching solution exhibiting high selectivity with respect to the relaxed SiGe layer 4, such as a solution comprising at least one of the following compounds: KOH (potassium hydroxide), $NH_4OH$ (ammonium hydroxide), TMAH (tetramethylammonium hydroxide), EDP (ethylenediamine/pyrocatechol/pyrazine) or $HNO_3$, or solutions that combining agents such as $HNO_3$, $HNO_2H_2O_2$, HF, $H_2SO_4$, $H_2SO_2$, $CH_3COOH$, $H_2O_2$ and $H_2O$, as explained in PCT patent application WO 99/53539 and U.S. published patent application No. 2001/0003269 A1. This further step is preferably used to retain good surface quality and good thickness homogeneity of the relaxed SiGe layer 4. Thus, a layer quality substantially identical to that obtained during its growth (shown in FIG. 3) of the boundary 7 is retained. This is because this transferred layer 4 has preferably not been subjected to external mechanical stresses or mechanical stresses sufficient to substantially alter this quality, such as those that can be generated by a CMP finishing step, thus avoiding the appearance of defects associated with such stresses.

Figure 9:
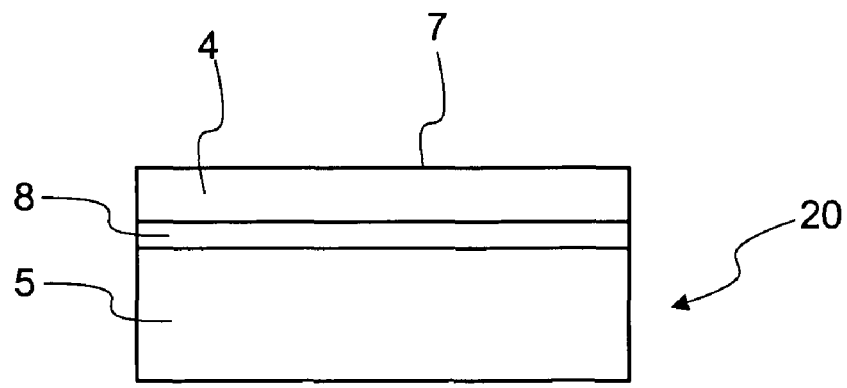
FIG. 9 shows an unfinished wafer with an insulator layer.

However, in certain particular cases, gentle polishing is carried out in order to remove any slight surface roughness. A relaxed SiGe-on-substrate semiconductor wafer structure 20 is obtained. A relaxed SiGe-on-insulator structure (i.e., an SGOI structure) can alternatively be obtained by adding a electrical insulator layer 8 between the relaxed layer 4 and the receiving substrate 5, as shown in FIG. 9, such as after the step shown in FIG. 3.

Figure 7:
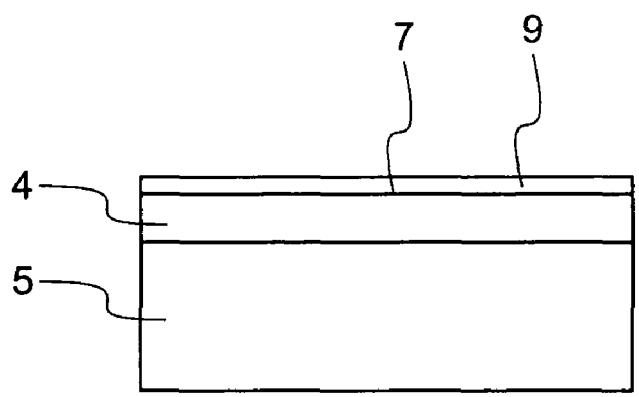
FIG. 7 shown an additional layer grown on the relaxed portion.

In one particular application of this structure 20, an epitaxy may be carried out on the relaxed SiGe layer after removal of the strained layer 3, such as epitaxy of another layer 9, which may be a device layer and may be a SiGe layer or a strained Si layer, as shown in FIG. 7. In the latter, a Si/SGOI final structure is obtained, with the Si layer being strained.

Having completed the building of the desired semiconductor wafer, a finishing step may optionally be carried out, such as finishing treatments like a heat treatment, to further strengthen the bonding interface with the receiving substrate 5. Where a heat treatment, such as an annealing step is carried out. During annealing, defects, such as pinholes, can appear in the crystalline structure of the wafer. The annealing can be conducted prior to the removal of the strained layer 3 from the relaxed layer 4 so that the strained layer protects the relaxed layer 4.

Optionally, after the splitting, the remaining portion of the matching layer 2 is removed from the strained layer, and the strained layer can be grown further, such as epitaxially, and can be oxidized. The oxidation can reduce or substantially prevent diffusion of germanium from the relaxed layer 4. As explained in WO99/52145, the presence of $SiO_2$ can help protect against these defects during annealing. The further growth of the strained layer is preferably conducted to thicken this layer to repair damage thereto caused by the removal, such as by etching, of the remaining portion of the matching layer. The regrowing may be carried out to thicken the strained layer back to its original thickness, and in any embodiment the regrowing is conducted preferably to maintain the thickness of the strained layer at less that its critical thickness, beyond which the strain in the layer is relaxed and defects can appear in the crystalline structure.

In one embodiment, the thickened strained layer can be used as an active layer to take advantage of the increased electron mobility, instead of removing the strained layer.

Other embodiments of the invention employ other materials for the matching layer 2, which may not include an SiGe lattice parameter matching layer 2, and may include a matching layer 2 made from other types of type III-V materials or other materials capable of providing the desired lattice parameter in the film 3 to match that of relaxed layer 4, including materials capable of straining the material of the epitaxially overgrown film 3. These materials preferably include indium, gallium, arsenic and combinations thereof such as gallium arsenide.

The present invention can be used for transferring other materials, instead or in addition to a relaxed SiGe layer 4, and may be used for transferring a layer of any type of semiconductor capable of being transferred according to the inventive method and to produce the inventive wafer Also, in each layer, including the semiconductor layers, other constituents may be added, such as carbon. The carbon may be added in a carbon concentration in the respective layer of less or substantially less than 50% by weight in one embodiment, about 50% in another embodiment, and more than 50% in another embodiment. A preferred carbon concentration is less than or about 5% by weight.

While illustrative embodiments of the invention are disclosed herein, it will be appreciated that numerous modifications and other embodiments may be devised by those skilled in the art. Therefore, it will be understood that the appended claims are intended to cover all such modifications and embodiments that come within the spirit and scope of the present invention.

What is claimed is:

1. A method of preparing a semiconductor wafer, comprising:
    growing a first layer of a first material in a strained state on a matching substrate comprising a matching layer;
    growing a second layer of a semiconductor second material, different from the first material, in a relaxed state on the first layer to form a boundary between the first and second layers and to form a composite structure which comprises the matching, first, and second layers, wherein the first and second layers each have substantially the same first lattice parameter;
    creating a region of weakness in the matching substrate to facilitate splitting;
    splitting the composite structure at the region of weakness into:
        an unfinished wafer that includes the second layer, the first layer, and at least a remaining portion of the matching layer, and
        a handle wafer:
    removing the remaining portion of the matching layer from the first layer; and
    removing the first layer from the second layer to produce a surface on the second layer that is substantially smooth and of substantially uniform thickness.

2. The method of claim 1, wherein the matching layer has the lattice parameter where it contacts the first layer that is substantially the same as the first lattice parameter of the first layer.

3. The method of claim 1, further comprising growing the matching layer on a handling substrate that has a second lattice parameter that is different from the first lattice parameter.

4. The method of claim 1, wherein the matching layer includes a buffer layer and a relaxed surface layer.

5. The method of claim 4, wherein the lattice parameter of the matching layer is graded between the first and second lattice parameters.

6. The method of claim 5, wherein the region of weakness is created in a portion of the matching layer that is in a substantially relaxed stale.

7. The method of claim 1, further comprising associating a receiving substrate with the second layer of the composite structure prior to splitting.

8. The method of claim 7, wherein the receiving substrate is bonded to the second layer.

9. The method of claim 7, further comprising providing an insulator between the second layer and receiving substrate.

10. The method of claim 1, wherein the region of weakness is created by implanting atomic species.

11. The method of claim 1, wherein the region of weakness is created by adding a porous layer.

12. The method of claim 1, wherein the first layer is strained to impart the first lattice parameter.

13. The method of claim 12, wherein the lattice parameter of the first material when strained is different than the lattice parameter of the first material in a relaxed state.

14. The method of claim 1, wherein the first layer is removed by etching.

15. The method of claim 14, wherein the remaining portion of the matching layer is removed from the unfinished wafer by etching.

16. The method of claim 1, wherein the boundary with the first layer removed is sufficiently smooth for growing a substantially uniform and substantially smooth device layer thereon of a semiconductor material that is different from that of the second layer and that has a lattice parameter that is adapted to match that of the second layer.

17. The method of claim 1, wherein the first material is a semiconductor.

18. The method of claim 1, further comprising growing a device layer on the surface.

19. The method of claim 1, wherein the region of weakness is created at a depth from the second layer sufficient for substantially preventing damage to the second layer.

20. The method of claim 19, wherein a damaged region in the matching substrate and outside the second layer is created adjacent the region of weakness by the creation of the region of weakness.

21. The method of claim 19, wherein the region of weakness is created by implanting atomic species to said depth.

22. The method of claim 19, wherein the first layer is removed by selective etching.

23. The method of claim 1, wherein the matching layer and the second layer comprise silicon germanium.

24. The method of claim 1, wherein the produced surface of the second layer is substantially at said boundary.

25. The method of claim 1, wherein the remaining portion of the matching layer is removed from the first layer and the first layer are removed from the second layer by selective removal processes.

26. The method of claim 25, wherein the selective removal processes each comprises selective etching.

27. A method of preparing a semiconductor wafer, comprising:
   providing a first layer of material in a strained state on a matching substrate that comprises a matching layer,
   growing a second layer of a semiconductor second material, different from the first material, in a relaxed state on the first layer to form a boundary between the first and second layers and to form a composite structure which comprises the matching, first, and second layers, wherein the first and second layers each have substantially the same first lattice parameter;
   creating a region of weakness in the matching substrate to facilitate splitting;
   splitting the composite structure into:
      an unfinished wafer that includes the second layer and at least a remaining portion of the matching layer, and
      a handle wafer;
   removing the remaining portion of the matching layer from the unfinished wafer by selective etching; and
   removing the first layer from the second layer by selective etching to produce a surface on the second layer.

* * * * *

UNITED STATES PATENT AND TRADEMARK OFFICE
CERTIFICATE OF CORRECTION

PATENT NO. : 7,018,910 B2
DATED : March 28, 2006
INVENTOR(S) : Ghyselen et al.

It is certified that error appears in the above-identified patent and that said Letters Patent is hereby corrected as shown below:

<u>Column 12,</u>
Line 31, after "substantially relaxed" delete "stale" and insert -- state --.

Signed and Sealed this

Thirtieth Day of May, 2006

JON W. DUDAS
*Director of the United States Patent and Trademark Office*